(12) United States Patent  (10) Patent No.:  US 6,205,069 B1
Kim  (45) Date of Patent:  Mar. 20, 2001

(54) SEMICONDUCTOR MEMORY DEVICE WITH FAST INPUT/OUTPUT LINE PRECHARGE SCHEME AND METHOD OF PRECHARGING INPUT/OUTPUT LINES THEREOF

(75) Inventor: Byung Chul Kim, Suwon (KR)

(73) Assignee: Samsung Electronics Co., Ltd., Kyunggi-do (KR)

( * ) Notice: Subject to any disclaimer, the term of this patent is extended or adjusted under 35 U.S.C. 154(b) by 0 days.

(21) Appl. No.: 09/496,948

(22) Filed: Feb. 3, 2000

(30) Foreign Application Priority Data

Feb. 5, 1999 (KR) .................................................. 99-3937

(51) Int. Cl.$^7$ .................................................... G11C 7/00
(52) U.S. Cl. ........................ 365/203; 365/190; 365/238.5
(58) Field of Search ................................ 365/203, 233, 365/190, 230.02, 230.03, 238, 238.5

(56) References Cited

U.S. PATENT DOCUMENTS 5,652,724 * 7/1997 Manning ......................... 365/189.05
5,802,010 * 9/1998 Zagar et al. ...................... 365/233.5
5,982,674 * 11/1999 Lines et al. ...................... 365/189.02

* cited by examiner

Primary Examiner—Son Mai
(74) Attorney, Agent, or Firm—Skjerven, Morrill, MacPherson LLP; David T. Millers

(57) ABSTRACT

A semiconductor memory device precharges IO lines of the device rapidly at a write interrupt in normal and full page modes. The device includes a write interrupt detector, a precharge signal generator, and a precharge circuit. The write interrupt detector detects whether signals indicating a write interrupt in the normal mode are from the outside, and then generates a write interrupt detection signal. The precharge signal generator generates first and second precharge signals in response to the write interrupt detection signal, and the precharge circuit precharges IO lines at both sides of a memory cell array of the device before a read or write operation in the normal mode in response to the first and second precharge signals. Since the address access time of the semiconductor memory device is short, a high-speed semiconductor memory device can be implemented using the present invention.

6 Claims, 12 Drawing Sheets

SEMICONDUCTOR MEMORY DEVICE WITH FAST INPUT/OUTPUT LINE PRECHARGE SCHEME AND METHOD OF PRECHARGING INPUT/OUTPUT LINES THEREOF

BACKGROUND

1. Field of the Invention

The present invention relates to a semiconductor memory device and more particularly to a circuit for controlling an input/output line (hereinafter, referred to as an "IO line") precharge in synchronization with a clock signal and a method for IO line precharge.

2. Description of Related Art

Semiconductor memory devices, particularly dynamic random access memories (DRAMs), are widely used in electronic systems for storing digital information. As the electronic systems operate at faster processing speeds, the access time for reading or writing data becomes a significant factor in the DRAM design. Hence, various techniques are used for improving DRAM access time. For example, "nibble mode" operation accesses a series of four sequential bits after accessing the first bit of the series. "Burst mode" operation sequentially accesses a full page or a row of bits after accessing the first bit of the page or the row. In the burst mode operation, after the input of an initial address of the first bit, subsequent addresses for the page or the row are internally generated without input of the subsequent addresses to the DRAM. Thus both the nibble and burst mode operations shorten DRAM access time by eliminating address re-loading delays associated with the subsequent bits.

The time from the input of a column address strobe (CASB) command to a data output is often called address access time $t_{AA}$. To decrease the address access time $t_{AA}$, the time required for precharging IO lines to a predetermined voltage, for example, a power supply voltage or half the power supply voltage, must be reduced because a column selection line (CSL) is enabled after IO lines are precharged. This is described below in detail.

FIG. 1 is a block diagram showing a known DRAM device 1 according to the prior art, which operates in synchronization with an externally applied clock signal (an external clock signal). The DRAM 1 has a memory cell array 10, and the memory cells in the array 10 are arranged at intersections of word lines WLi (i=0 to m) and bit lines BLj (j=0 to n). Each row of the memory array 10 is commonly referred to as a page. The bit lines BLj are divided into two groups, each of which includes pairs of the bit lines BLj. The first group includes bit line pairs BL0 and BL1, BL4 and BL5, ..., BLn-3 and BLn-2, and the second group includes bit line pairs BL2 and BL3, BL6 and BL7, ..., BLn-1 and BLn. A row decoder circuit 20 selects and drives one of the word lines WLi.

IO line pairs IOi and IOiB (i is 2 or more) are at the left side of the array 10, and IO line pairs IOj and IOjB (j is 2 or more) are at the right side of the array 10. FIG. 1 shows only a pair of the IO lines IOi and IOiB and a pair of the IO lines IOj and IOjB. The IO lines IOi and IOiB connect to an IO line driver circuit 30 (a first IO line driver), which in response to a signal CA8B drives the IO lines IOi and IOiB with data to be written. A precharge circuit 40 (a first precharge circuit), which is controlled by a precharge signal PIOP_8B from a precharge controller 120, precharges the IO lines IOi and IOiB. Similarly, the IO lines IOj and IOjB connect to an IO line driver circuit 30' (a second IO line driver), which drives the IO line pair IOj and IOjB with data to be written in response to a signal CA8 that is complementary to the signal CA8B. A precharge circuit 40' (a second precharge circuit), which is controlled by a precharge signal PIOP_8 from a precharge controller 120, precharges the IO lines IOj and IOjB.

The bit lines, for example, BL0 and BL1, as a pair, connect either to the IO lines IOi and IOiB or to the IO lines IOj and IOjB through bit line sense amplifiers 50 and column selection transistors ST. The gates of the column selection transistors ST connect to a column decoder circuit 80 through column selection lines CSL0 to CSLn. In operation, the IO lines IOi and IOiB are precharged, and the IO lines IOj and IOjB have data to be written/read to/from a memory cell associated with a selected word line and a selected bit lines. When the IO lines IOi and IOiB carry data for writing, the IO lines IOj and IOjB are precharged. An access to the array 10 is performed through the IO lines IOi and IOiB or the IO lines IOj and IOjB.

The above-described IO multiplexing and precharging techniques are disclosed in U.S. Pat. No. 4,754,433, entitled "DYNAMIC RAM HAVING MULTIPLEXED TWIN I/O LINE PAIRS", U.S. Pat. No. 5,761,146, entitled "DATA IN/OUT CHANNEL CONTROL CIRCUIT OF SEMICONDUCTOR MEMORY DEVICE HAVING MULTI-BANK STRUCTURE", U.S. Pat. No. 5,742,185, entitled "DATA BUS DRIVE CIRCUIT FOR SEMICONDUCTOR MEMORY DEVICE", and U.S. Pat. No. 5,734,619, entitled "SEMICONDUCTOR MEMORY DEVICE HAVING CELL ARRAY DIVIDED INTO A PLURALITY OF CELL BLOCKS", which are incorporated herein by their entireties.

The precharge controller 120 includes a write interrupt read (WIR) detector 90, an address transition detector 100, and a precharge signal generator 110, and generates the precharge signals PIOP_8B and PIOP_8 when a write interrupt WI occurs. The write interrupt WI starts a write operation through one of the IO lines IOi and IOiB and the IO lines IOj and IOjB and then a write/read operation is performed through the other of the IO lines IOi and IOiB and the IO lines IOj and IOjB. A known circuit diagram of the WIR detector 90 is illustrated in FIG. 2. The WIR detector 90 includes two NOR gates G1 and G4, a transmission gate TG1, a latch L1 including two invertors INV2 and INV3, two NAND gates G2 and G3, an invertor INV4, and a pulse generator 91.

In FIG. 2, a signal PWR indicates an operation state at the previous clock cycle, wherein the high and low levels of the signal PWR respectively denote a write operation and a read operation. A signal PWRF indicates an operation state at the present clock cycle. When the signal PWRF is low, a read operation is performed during the present clock cycle. When the signal PWRF is high, a write operation is performed at the present clock cycle. The signal PWRF is not synchronized with the external clock signal. Namely, the signal PWRF is supplied directly into the WIR detector 90 through a buffer circuit (not shown) without setup or hold time. Signals PCF and PCSF, which are not synchronized with external clock signal and are supplied directly into the WIR detector 90 without setup and hold time, indicate a column address strobe signal CASB and a chip select signal CSB, respectively.

The operation of the WIR detector 90 is set forth below with reference to FIGS. 1 and 2. A write interrupt read operation occurs when a write operation is performed in association with the IO lines IOi and IOiB, and then a read operation is required in association with the IO lines IOj and IOjB. When the write interrupt read operation occurs, the signal PWRF becomes low. Since the signal PWR is high, an output signal A of the NOR gate G1 becomes low. When a clock signal PCLKF from a clock buffer 130 is high, an output signal B of the NAND gate G2 becomes low. This makes an output signal C of the NOR gate G4 transit from low to high, since both inputs of the NOR gate G4 are then low. Accordingly, the pulse generator 91 activates a write interrupt read detection signal PWIR to a high level.

On the other hand, when the write operation in association with the IO lines IOi and IOiB is interrupted, and then a write operation is required in association with the second IO lines IOj and IOjB, that is, when a write interrupt write (WIW) operation occurs, the signal PWRF remains high. Since the signal PWR is high, the output signal A of the NOR gate G1 is low. Successively, when a clock signal PCLKF from the clock buffer 130 is high, the output signal B of the NAND gate G2 remains high because an input signal of the NAND gate G2 from the inverter INV4 is low. Therefore, the input signal C and the output signal PWIR of the pulse generator 91 continue to be low.

The WIR detector 90 makes the signal PWIR activated high and inactivate low, respectively when the read operation after the write interrupt is required (that is, at the WIR operation), and when the write operation thereafter is required (that is, at the WIW operation).

FIG. 3 shows the address transition detector 100 that includes two pulse generators 101 and 102. Receiving a signal CA8 as its input signal, the pulse generator (a first pulse generator) 101 includes a delay circuit having three invertors INV11 to INV13, three resistors R7 to R9, and three MOS capacitors C6 to C8 connected to one another as illustrated in FIG. 3. The pulse generator 101 further includes a NAND gate G6 having three input terminals, which receive an output signal of the delay circuit, the signal CA8 and the signal PWR, respectively, and an output terminal outputting a first address transition detection signal PATD1. Similarly, receiving a complementary signal CA8B of the signal CA8 as its input signal, the pulse generator (a second pulse generator) 102 is implemented similarly to the first pulse generator 101, and description thereof is thus omitted. When the signal CA8 transits from low to high, the first address transition detection signal PATD1 becomes low for a time determined by the delay circuit, and a second address transition detection signal PATD2, which is from the second pulse generator 102, remains high. On the contrary, when the signal CA8B transits from low to high, the second address transition detection signal PATD2 becomes low for the delay time, and the first address transition detection signal PATD1 remains high.

The signals CA8 and CA8B of FIG. 3 are supplied from the address buffer circuit 60 of FIG. 1 in synchronization with a rising edge of the clock signal PCLK. The signals CA8 and CA8B select either the first IO lines IOi and IOiB or the second IO lines IOj and IOjB. For example, when the signal CA8B is high, an access operation is performed through the first IO lines IOi and IOiB, and when the signal CA8 is high the access operation is performed through the second IO lines IOj and IOjB.

Referring to FIG. 3, the precharge signal generator 110 receives the write interrupt read detection signal PWIR and the first and second address transition detection signals PATD1 and PATD2, and generates first and second precharge signals PIOP_8B and PIOP_8. The generator 110 has six inverters INV17 to INV22 and three NAND gates G8, G9 and G10 connected to one another as shown in FIG. 3.

Referring to FIGS. 1 and 3, when the WIR operation is required, the signal PWIR from the write interrupt read detector 90 is high. Accordingly, regardless of the first and second address transition detection signals PATD1 and PATD2, the NAND gates G9 and G10 activate the first and second precharge signals PIOP_8B and PIOP_8 to high. When the first precharge signal PIOP_8B is activated, the precharge circuit 40 precharges the IO lines IOi and IOiB. Similarly, when the second precharge signal PIOP_8 is activated, the precharge circuit 40' precharges the IO lines IOj and IOjB.

Referring to FIGS. 1 and 3, when the WIW operation is required, the PWIR signal becomes low as described above, so that input terminals of the NAND gates G9 and G10 connected commonly to the invertor INV22 becomes high if a signal CA11B is also high. Thus, logic levels of the first and second precharge signals PIOP_8B and PIOP_8 are determined according to those of the first and second address transition detection signals PATD1 and PATD2. Column addresses for the WIW operation are provided into the address buffer circuit 60 from the outside, and then the signals CA8 and CA8B from the address buffer circuit 60 are supplied to the address transition detector 100 in synchronization with a rising edge of the clock signal PCLK.

When the signals CA8 and CA8B are respectively high and low, the first address transition detection signal PATD1 from the first pulse generator 101 of the detector 100 pulses low, and the second address transition detection signal PATD2 from the second pulse generator 102 the detector 100 remains high. When the precharge signal generator 110 receives the first address transition detection signal PATD1 of the low level and the second address transition detection signal PATD2 of the high level, the first precharge signal PIOP_8B becomes high, and the second precharge signal PIOP_8 becomes low. As a result, only the IO lines IOi and IOiB are precharged by the first precharge circuit 40 which the first precharge signal PIOP_8B of the high level activates.

Accordingly, the precharge signal generator 110 keeps both the first and second precharge signals PIOP_8B and PIOP_8 high when the WIR operation is requested after the write interruption. The precharge signal generator 110 pulses one of the first and second precharge signals PIOP_8B and PIOP_8 high when the WIW operation is requested after the write interruption.

As described above, when an access operation through the IO lines IOj and IOjB is requested after a write operation through the IO lines IOi and IOiB, that is, when a write interrupt read/write (WIW/WIR) operation is requested, the IO lines IOi and IOiB have to be precharged before the access through the second IO lines IOj and IOjB. The reason for this is as follows. After data is written in a selected memory cell MC (FIG. 1) through the IO lines IOi and IOiB, the array 10 is accessed through the IO lines IOj and IOjB. If the access operation through the IO lines IOj and IOjB and the column selection line CSLn is performed without precharging the IO lines IOi and IOiB, the data written in the memory cell MC through the IO lines IOi and IOiB can be reversed. Accordingly, a write error could occur at the WIW/WIR operation. This is because the column selection transistors ST associated with the IO lines IOi and IOiB, and IOj and IOjB are commonly coupled with the column selection line CSLn. Therefore, IO lines having written data before a write interrupt must be precharged through a corresponding precharge circuit.

Referring to FIGS. 1, 3, and 4A, a conventional write interrupt read operation is as follows. Assuming that a write operation is performed through the IO lines IOi and IOiB at a clock cycle, for example, n-th clock cycle as shown in FIG. 4A. When the WIR operation is required for the IO lines IOj and IOjB at a next clock cycle, for example, (n+1)th clock cycle, a write enable signal WEB is high, and the column address strobe signal CASB is toggled. Accordingly, at the (n+1)th clock cycle, the WIR detector 90 responds to the signal PWRF of a low level and generates the signal PWIR of a high level in synchronization with a rising edge of the clock signal PCLKF as described with reference to FIG. 2. The clock signal PCLKF slightly leads the clock signal PCLK. Continuously, the precharge signal generator 110 (FIG. 1) makes the first and second precharge signals PIOP_8B and PIOP_8 high. As a result, the IO lines IOi and IOiB, and IOj and IOjB are precharged through corresponding precharge circuits 40 and 40', which are activated in response to the first and second precharge signals PIOP_8B and PIOP_8, respectively. After the IO precharge operation has been ended, a column selection line CSL associated with the WIR operation is selected through the column decoder circuit 80, and data read from the array 10 is loaded onto the IO lines IOj and IOjB.

Referring to FIGS. 1, 3, and 4B, a conventional write interrupt write operation in a normal mode is as follows. A write operation is performed through the IO lines IOi and IOiB at n-th clock cycle as shown in FIG. 4B. When the WIW operation is required for the IO lines IOj and IOjB at next clock cycle, the write enable signal WEB and the column address strobe signal CASB are toggled. Then, the write interrupt read detection signal PWIR of the WIR detector 90 continues to be low, so that the input terminals of the NAND gates G9 and G10 connected to the inverter INV22 have the logical high level. Therefore, the first and second address transition detection signals PATD1 and PATD2 determine the logic states of the first and second precharge signals PIOP_8B and PIOP_8.

Further, an address signal A8 from among the column address signals, which are provided from the outside for the WIW operation, is latched in a latch (not shown) of the address buffer circuit 60 in synchronization with a falling edge of the clock signal PCLK at the n-th clock cycle. Then, the address signal A8 held in the latch is converted and outputted into address signals CA8 and CA8B in synchronization with a rising edge of the clock signal PCLK at the (n+1)th clock cycle. Assuming that the address signal A8 is high, the address signal CA8 becomes high, and the complementary address signal CA8B becomes low. As a result, the first pulse generator 101 of the address transition detector 100 pulses the signal PATD1 to the low level in response to the signal CA8. At this time, the second address transition detection signal PATD2 remains high. The precharge signal generator 110 produces the first precharge signal PIOP_8B of a high level and the second precharge signal PIOP_8 of a low level, so that only the IO lines IOi and IOiB are precharged. After the precharge operation has been completed, a column selection line CSL associated with the WIW operation is selected through the column decoder circuit 80, and then data loaded onto the IO lines IOj and IOjB is written to the array 10.

Referring to FIGS. 1, 3, and 4C, a conventional write interrupt write operation in a full page mode is as follows. At the full page mode, for example, a half of the memory cells connected to a selected word line (page) are accessed through the IO lines IOi and IOiB, and then the other half of the memory cells are accessed through the second IO lines IOj and IOjB. As described above, in order to prevent a write error, the IO lines IOi and IOiB have to be precharged prior to the access through the IO lines IOj and IOjB. The WIW operation at the full page mode is the same as the WIW operation at the normal mode of FIG. 4B except that an address signal PCA8B instead of the address signal A8 is provided from a burst counter 70.

In the above-described IO precharge scheme, the WI operation is divided into the WIR and WIW operations. The WIW operation at a normal or full page mode precharges the first or second IO lines by use of address transition information, that is, the address transition detection signals PATD1 and PATD2. The WIR operation of the normal mode precharges the first and second IO lines by use of an external command transition information, that is, the write interrupt read detection signal PWIR. According to the IO precharge scheme, as shown in FIG. 4B, the IO precharge time of the normal mode WIW operation is delayed by the time $\Delta t$ relative to that of the normal mode WIR operation. Thus, a column selection line CSL is enabled after the time $\Delta t$ at the WIW operation. This also happens in the full page mode WIW operation. The delay occurs because a command transition detection time occurs prior to an address transition detection time. That is, the WIR and WIW operations are performed in synchronization with rising edges of the clock signal PCLKF and of the clock signal PCLK, respectively, and the clock signal PCLK occurs later than the signal PCLKF. Furthermore, a transmission path of the address signal supplied to the address transition detector 100 is longer than that of a command signal supplied into the WIR detector 90.

Accordingly, a write time at the WIW operation is longer than that at the WIR operation. This affects the time $t_{AA}$ from the CASB command input to the data output, so that the address access time $t_{AA}$ becomes longer. Therefore, the address access and write time of the prior DRAM device 1 are extended.

SUMMARY OF THE INVENTION

In accordance with an embodiment of the present invention, a semiconductor memory device precharges IO lines of the device rapidly at a write interrupt of normal and full page modes. The device includes a precharge controller for controlling a precharge operation of the IO lines. The precharge controller has a write interrupt detector, a full page mode detector, an address transition detector, and a precharge signal generator. The precharge controller precharges the IO lines at both sides of a memory cell array of the device after detecting the transition of an external command (for example, a write enable signal) whenever a write interrupt occurs in a normal mode. Thus, the IO precharge time in a write interrupt read operation is the same as that in a write interrupt write operation. In addition, the precharge controller precharges the IO lines at one side of the array after detecting the transition of an internally generated sequential address in synchronization with a falling edge of an internal clock signal when a write interrupt occurs at a full page mode.

BRIEF DESCRIPTION OF THE DRAWINGS

Use of the same reference symbols in different figures indicates identical or similar items.

DESCRIPTION OF THE PREFERRED EMBODIMENT

Figure 5:
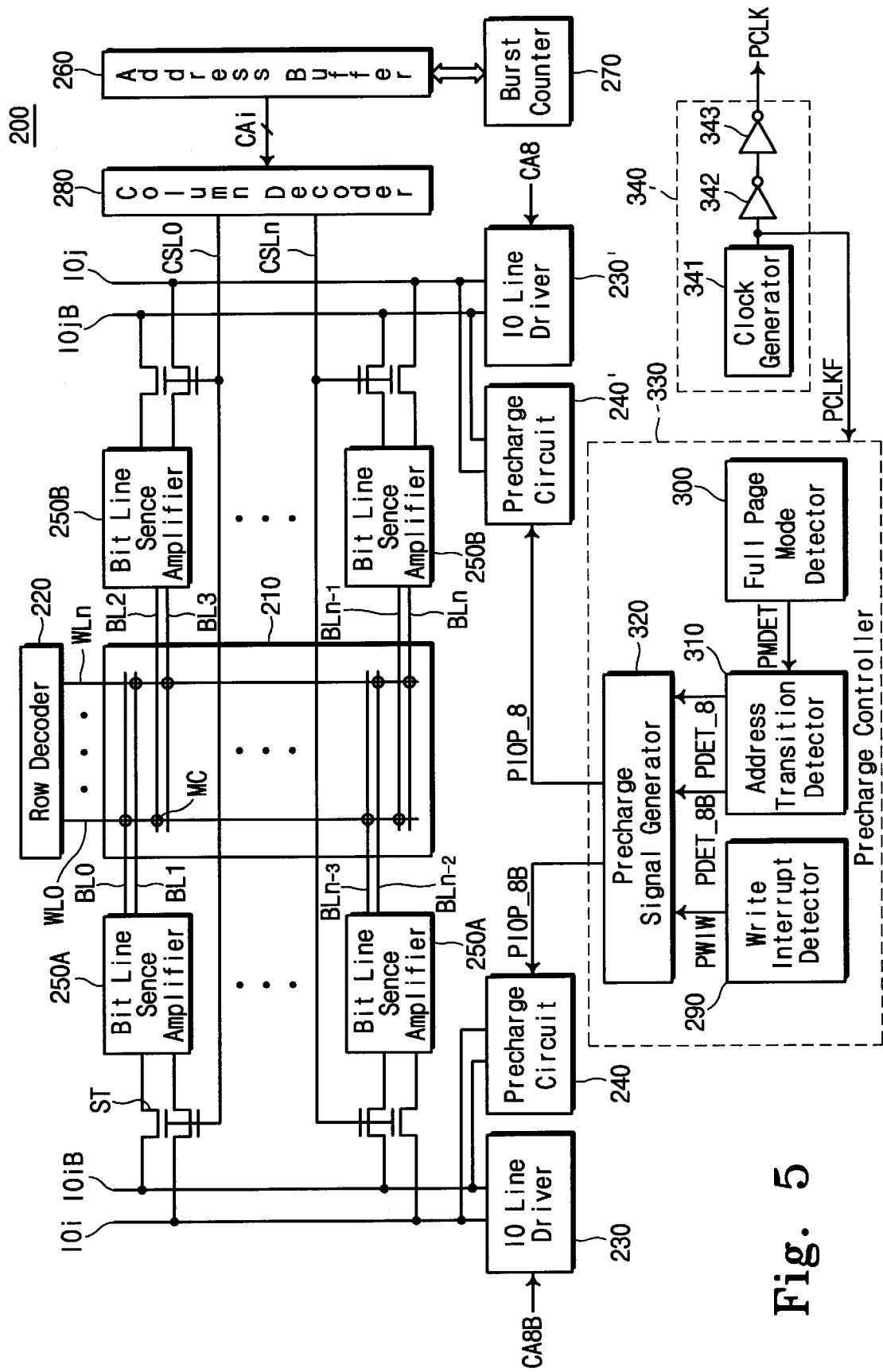
FIG. 5 is a block diagram of a DRAM according to an embodiment of the present invention.

FIG. 5 is a block diagram of a dynamic random access memory (DRAM) 200 according to an embodiment of the present invention, which operates in a normal mode and a full page mode in synchronization with external clock signal. The DRAM 200 has an array 210 of memory cells MC, which are at the intersections of word lines (pages) WLi (i=0 to m) and bit lines BLj (j=0 to n). Each of the memory cells MC includes a storage capacitor and a charge transfer transistor. The bit lines BLj are divided into two groups, each of which includes pairs of the bit lines BLj. For instance, the first group includes pairs of bit line pairs BL0 and BL1, BL4 and BL5, . . . , BLn-3 and BLn-2, and the second group includes bit line pairs BL2 and BL3, BL6 and BL7, . . . , BLn-1 and BLn. A row decoder circuit 220 selects and drives one of the word lines WLi. Two or more IO line pairs IOi and IOiB are to the left of the array 210, and two or more IO line pairs IOj and IOjB are to the right of the array 210. Although the DRAM 200 includes a number of IO lines, FIG. 5 shows only one IO line pair from the group of the IO line pairs IOi and IOiB and one IO line pair from the group of the IO line pairs IOj and IOjB.

The IO line pair IOi and IOiB connects to an IO line driver circuit (or a first IO line driver circuit) 230. In response to a signal CA8B from an address buffer circuit 260, the first IO line driver circuit 230 drives the IO line pair IOi and IOiB with data to be written. A precharge circuit (or a first precharge circuit) 240 precharges the IO line pair IOi and IOiB. The first precharge circuit 240 is adjacent to the first IO line driver circuit 230 and controlled by a first precharge signal PIOP_8B from a precharge controller 330. Similarly, the IO line pair IOj and IOjB connects to an IO line driver circuit (or a second IO line driver circuit) 230'. The second IO line driver circuit 230' drives the IO line pair IOj and IOjB with data to be written in response to a signal CA8 from the address buffer circuit 260. A precharge circuit 240' (or a second precharge circuit), which precharges the IO line pair IOj and IOjB, is adjacent to the second IO line driver circuit 230' and controlled by a second precharge signal PIOP_8 from the precharge controller 330.

A group of bit lines, for example, BL0 and BL1, connect to the IO lines IOi and IOiB through a bit line sense amplifier 250A and column selection transistors ST. The gates of the column selection transistors ST connect to a column decoder circuit 280 through a column selection line CSL0. A group of bit lines, for example, BL2 and BL3, connect to the IO lines IOj and IOjB through a bit line sense amplifier 250B and column selection transistors ST. The gates of the column selection transistors ST also connect to the column decoder circuit 280 through the column selection line CSL. Other bit line pairs connect to either of the IO line pair IOi and IOiB, and the IO line pair IOj and IOjB in the same manner as described above.

Referring to FIG. 5, the DRAM 200 includes a precharge controller 330. When a signal indicating a write interrupt WI is detected in the normal mode, the precharge controller 330 activates first and second precharge signals PIOP_8B and PIOP_8 high, so that the IO lines IOi and IOiB, and IOj and IOjB are precharged simultaneously. In the full page mode, data is written to the array 210 through the IO lines IOi and IOiB and then written to the array 210 through the IO lines IOj and IOjB. In this case, the precharge controller 330 activates the first precharge signal PIOP_8B high, so that only the IO lines IOi and IOiB are precharged.

Figure 10A:
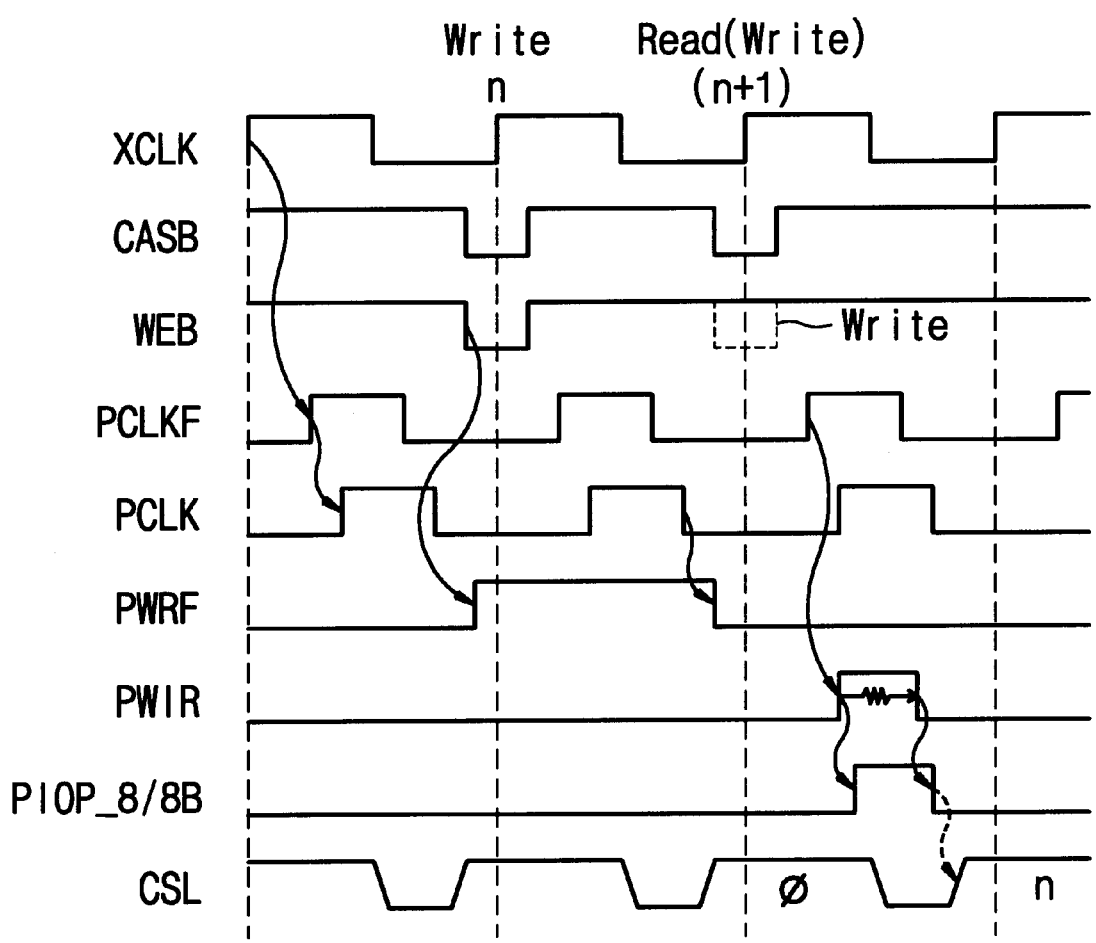
FIG. 10A is a timing diagram illustrating write interrupt read and write interrupt write operations in a normal mode according to another embodiment of the present invention.
Figure 10B:
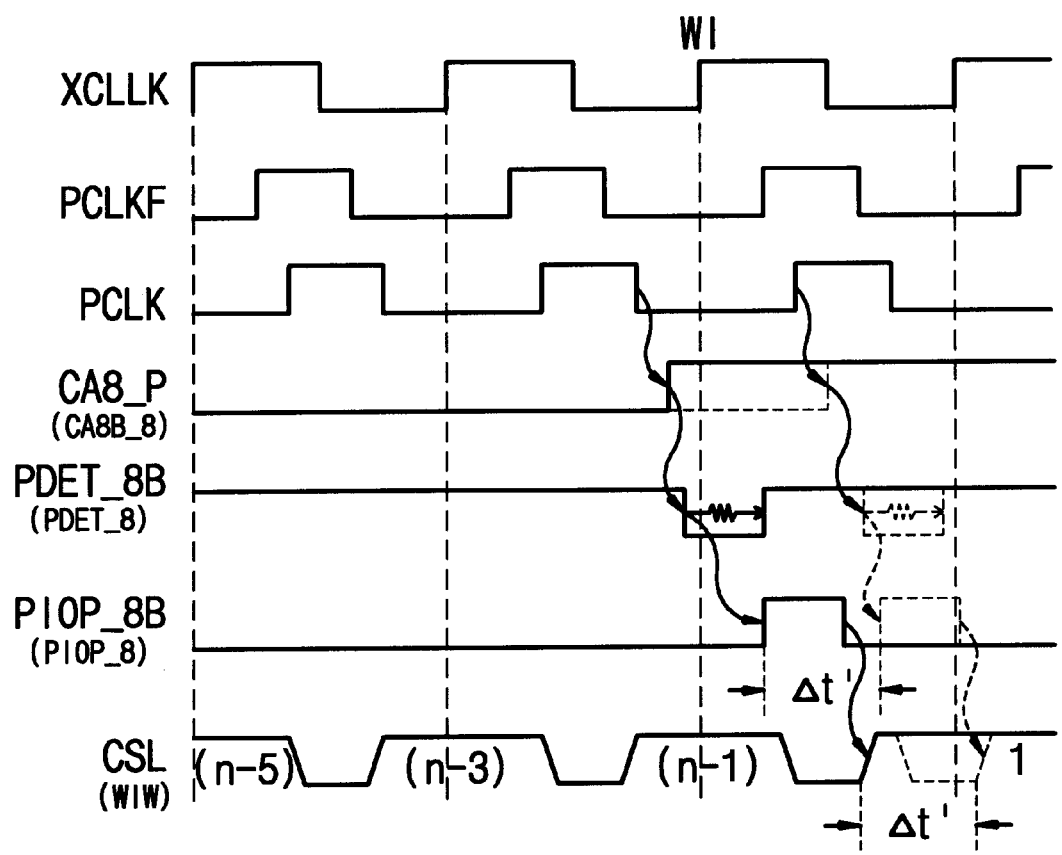
FIG. 10B is a timing diagram illustrating a write interrupt write operation in a full page mode according to another embodiment of the present invention.

The precharge controller 330 includes a write interrupt detector 290, a full page mode detector 300, an address transition detector 310, and a precharge signal generator 320. The write interrupt detector 290 responds to a signal directing a write or read operation, such as a write enable signal WEB, and a signal directing column address input, such as a column address strobe signal CASB. Further, the write interrupt detector 290 generates a write interrupt detection signal PWIW, which is synchronized with a rising edge of a clock signal PCLKF from a clock buffer circuit 340, whenever such a write interrupt (including write and read operations) is requested in the normal mode. The clock buffer circuit 340 receives an externally applied clock signal and produces a first clock signal PCLK and a second clock signal PCLKF. The clock signal PCLKF leads the clock signal PCLK and has the same period as the first clock signal PCLK, as shown in FIGS. 10A and 10B.

Figure 1:
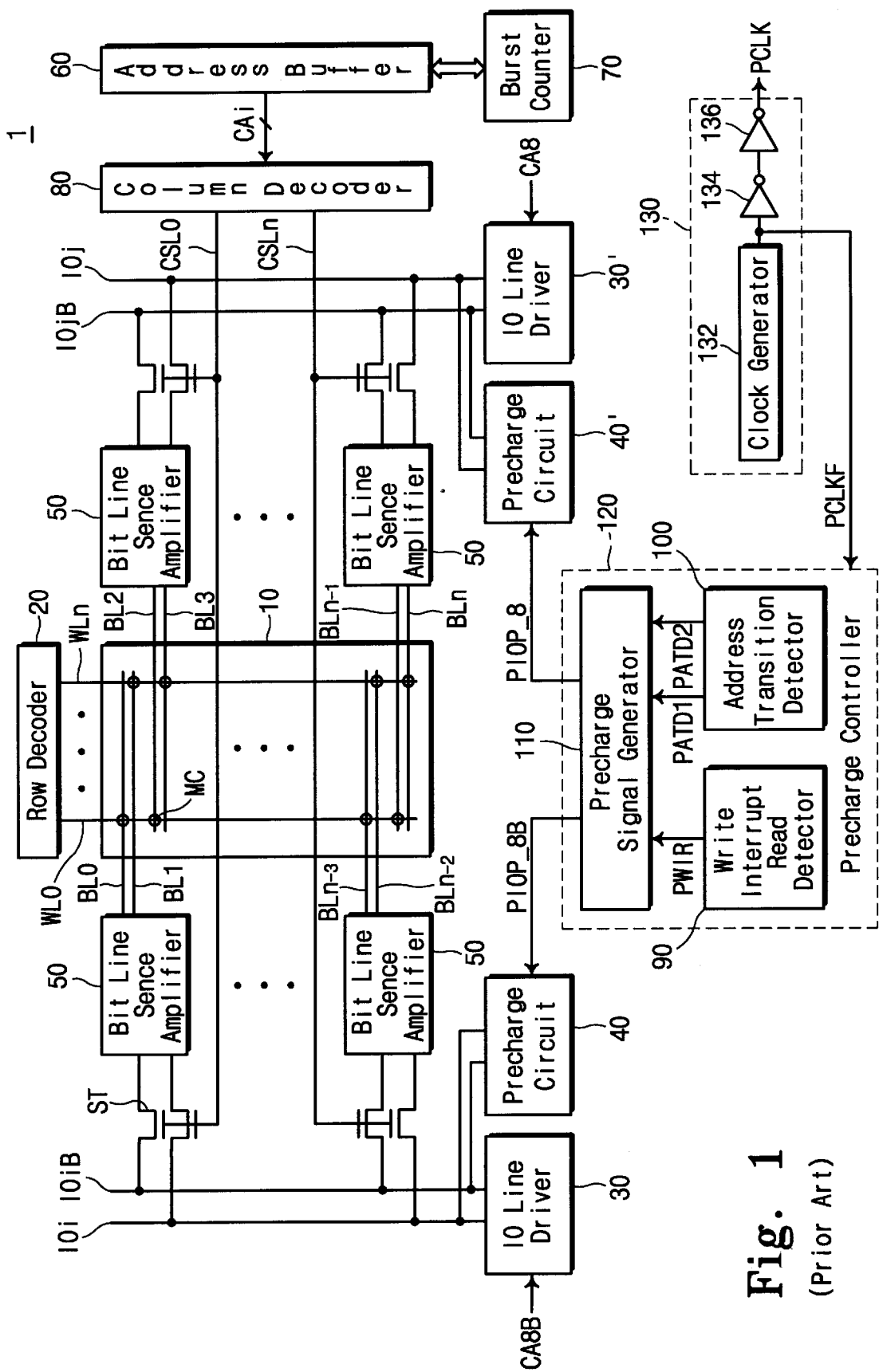
FIG. 1 is a block diagram showing a conventional DRAM.
Figure 2:
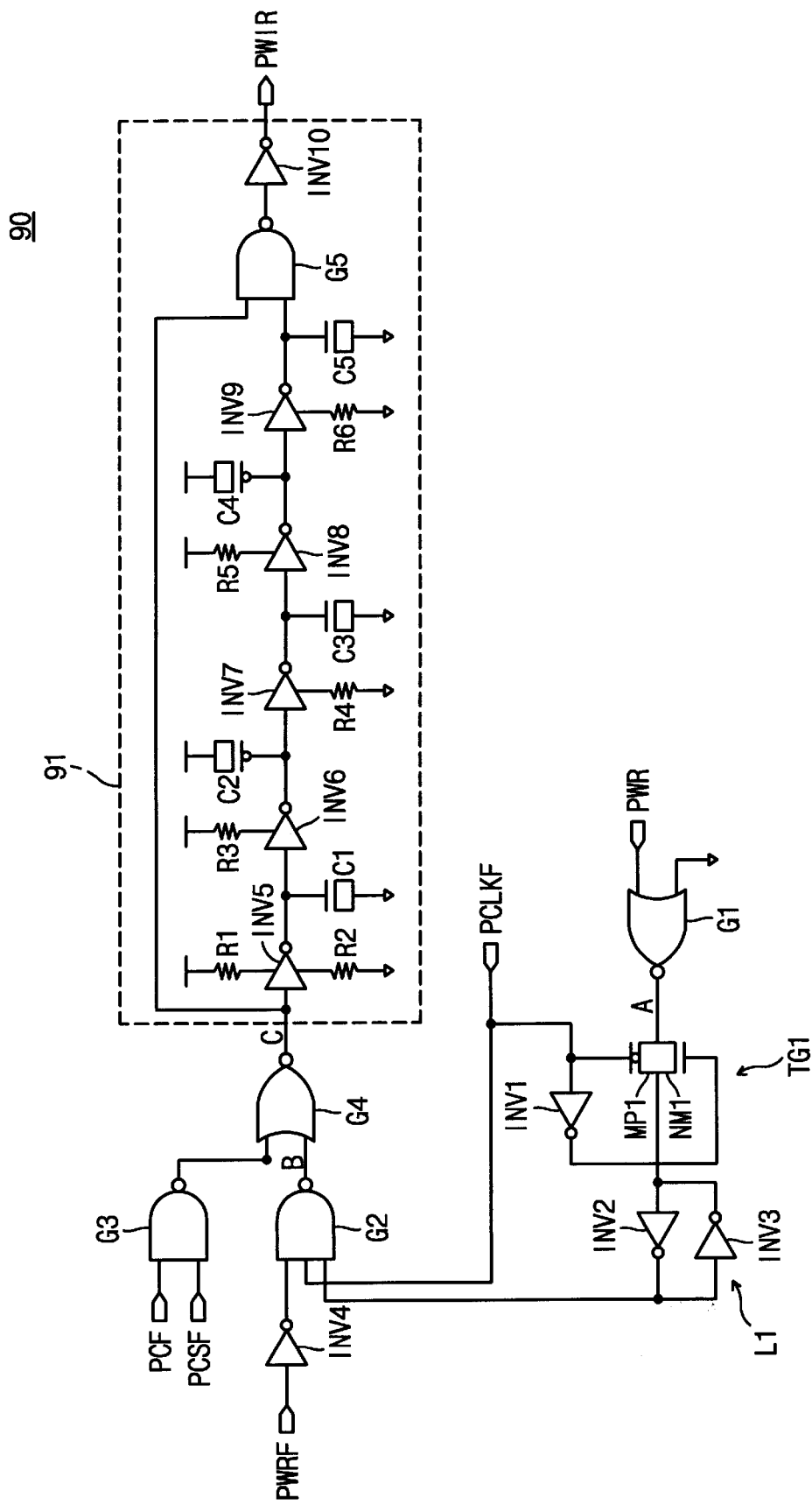
FIG. 2 is a circuit diagram of the write interrupt read detector of the DRAM of FIG. 1.
Figure 3:
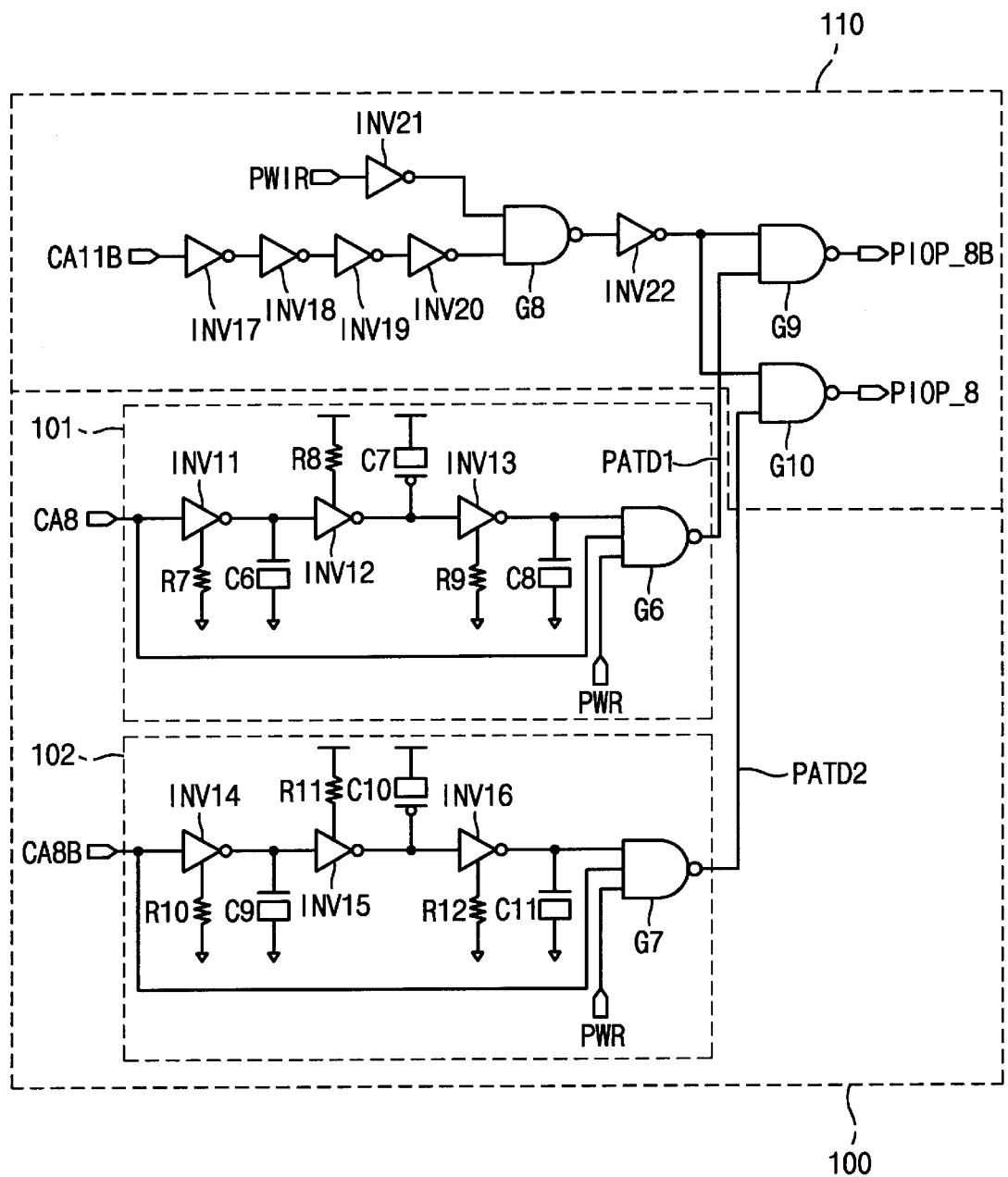
FIG. 3 is a circuit diagram of an address transition detector and a precharge signal generator of the DRAM of FIG. 1.
Figure 6:
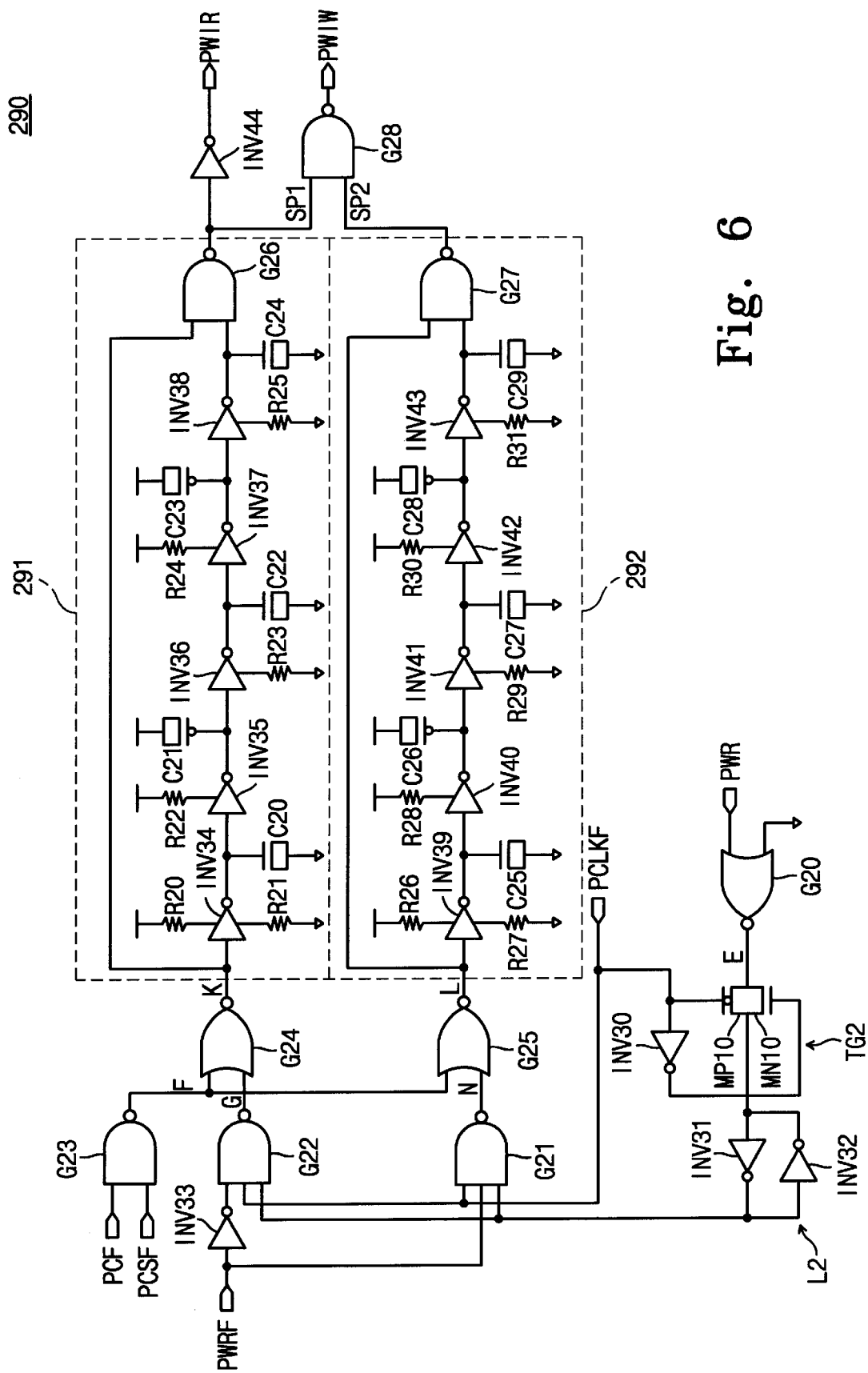
FIG. 6 is a circuit diagram of a write interrupt detector of FIG. 5.

FIG. 6 shows a circuit diagram of the write interrupt detector 290 according to an embodiment of the present invention. The write interrupt detector 290 includes three NOR gates G20, G24 and G25, four NAND gates G21, G22, G23 and G28, two invertors INV33 and INV44, a transmission gate circuit TG2 including an invertor INV30, a PMOS transistor MP10 and an NMOS transistor MN10, a latch circuit L2 including two invertors INV31 and INV32, and two pulse generators 291 and 292. The signals PWR, PWRF, PCLKF, PCF and PCSF are as described above with reference to FIG. 2.

A write interrupt read WIR operation and a write interrupt write WIW operation in the normal mode of the DRAM 200 are explained with reference to FIGS. 5 and 6. In the WIR operation, a write operation for the array 210 is performed through the IO lines IOi and IOiB at a clock cycle, for example, n-th clock cycle, and then a read operation is required through the IO lines IOj and IOjB at a next clock cycle, for example, (n+1)th clock cycle. Under this condition, the signals PWR, PCF, and PCSF become high, and the signal PWRF becomes low because the write enable signal WEB is high. Accordingly, an output signal E of the NOR gate G20 and an output signal F of the NAND gate G23 become low. When the clock signal PCLKF changes from low to high, the NAND gate G22 issues its output signal G of a low level, and the NAND gate G21 outputs signal H of a high level. This makes an output signal K of the NOR gate G24 high, and an output signal L of the NOR gate G25 becomes low. Thus, an output signal SP1 of the pulse generator 291 becomes low, and an output signal SP2 of the pulse generator 292 becomes high. As a result, the write interrupt detector 290 generates a write interrupt detection signal PWIW of a high level through the NAND gate G28.

In the write interrupt write WIW operation, a write operation for the array 210 is performed through, for example, the IO lines IOi and IOiB at a clock cycle, for example, n-th clock cycle, and then a write operation is required through, for example, the IO lines IOj and IOjB at a next clock cycle, for example, (n+1)th clock cycle. Under this condition, the signals PWR, PCF, and PCSF become high, and the signal PWRF also becomes high because the write enable signal WEB becomes low. Accordingly, the output signal E of the NOR gate G20 and the output signal F of the NAND gate G23 become low. When the clock signal PCLKF, which is earlier than a clock signal PCLK, changes from low to high, the output signal G of the NAND gate G22 becomes high, and the output signal H of the NAND gate G21 becomes low. Thus, the output signal K of the NOR gate G24 becomes low, and the output signal L of the NOR gate G25 becomes high, so that the output signal SP1 of the pulse generator 291 becomes high, and the output signal SP2 of the pulse generator 292 becomes low. As a result, the write interrupt detector 290 generates a write interrupt detection signal PWIW of a high level in a pulse form through the NAND gate G28.

The write interrupt detector 290 generates the write interrupt detection signal PWIW whenever the write interrupt occurs regardless of whether write or read operation is requested after the write interrupt. This means that the IO line precharge time is the same at the WIR the WIW operations, as described below.

Referring to FIG. 5, the full page mode detector 300 detects whether the DRAM 200 is in the full page mode. The full page mode detector 300 activates a full page mode detection signal PMDET to a high level when the DRAM 200 operates at the full page mode. The address transition detector 310 detects whether the address signals, which select between the IO lines IOi and IOiB and the IO lines IOj and IOjB, change in the full page mode.

Figure 7:
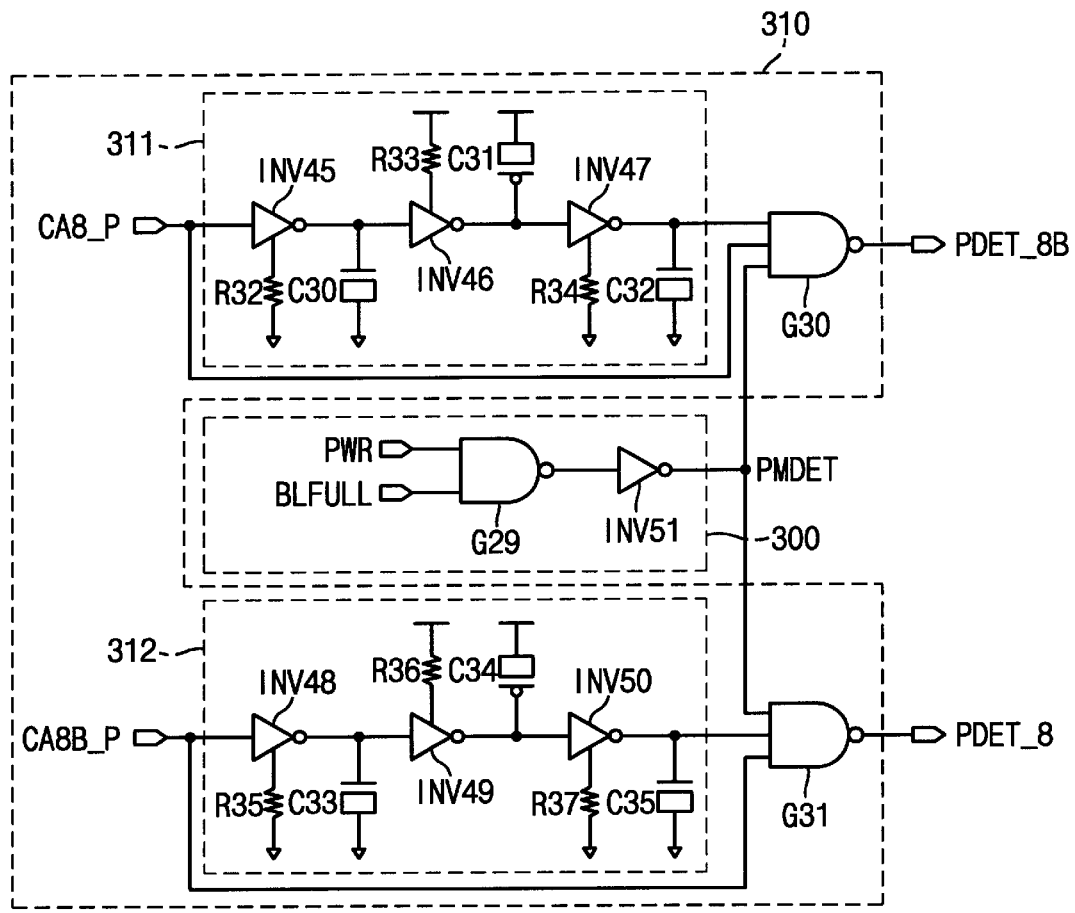
FIG. 7 is a circuit diagram of an address transition detector and a full page mode detector of FIG. 5.

FIG. 7 illustrates the detectors 300 and 310 according to an embodiment of the present invention. The full page mode detector 300 includes a NAND gate G29 and an invertor INV51. The NAND gate G29 has one input terminal receiving the signal PWR and the other input terminal receiving a signal BLFULL, and the invertor INV51 has an input terminal connected to an output terminal of the NAND gate G29 and an output terminal outputting the full page mode detection signal PMDET. When the signal BLFULL is high and low, the DRAM 200 (FIG. 5) operates at the full page mode and at a normal mode, respectively. Therefore, the full page mode detection signal PMDET becomes high when the DRAM 200 operates at the full page mode and performs a write operation. The signal PMDET becomes low when the DRAM 200 does not operate at the full page mode or perform a read operation.

The signal BLFULL is issued from a mode register set MRS (not shown). The MRS is programmed after power-on and before normal operation and may be changed during operation. Data contained in the mode register set MRS includes burst length, burst sequence type, column address strobe CASB latency, and whether the operation is a normal operation or a test mode operation.

The address transition detector 310 has two NAND gates G30 and G31, and two pulse generators 311 and 312. The address transition detector 310 pulses one of first and second address transition detection signals PDET_8B and PDET_8 low in response to address signals CA8_P and CA8B_P from the address buffer circuit 260 and the full page mode detection signal PMDET from the full page mode detector 300. That is, the address transition detector 310 responds to the transitions of the address signals CA8_P and CA8B_P when the full page mode detection signal PMDET is high. For example, when the address signal CA8_P transitions to high, the first address transition detection signal PDET_8B becomes low. When the address signal CA8B_P transitions to high, the second address transition detection signal PDET_8 becomes low.

Figure 9:
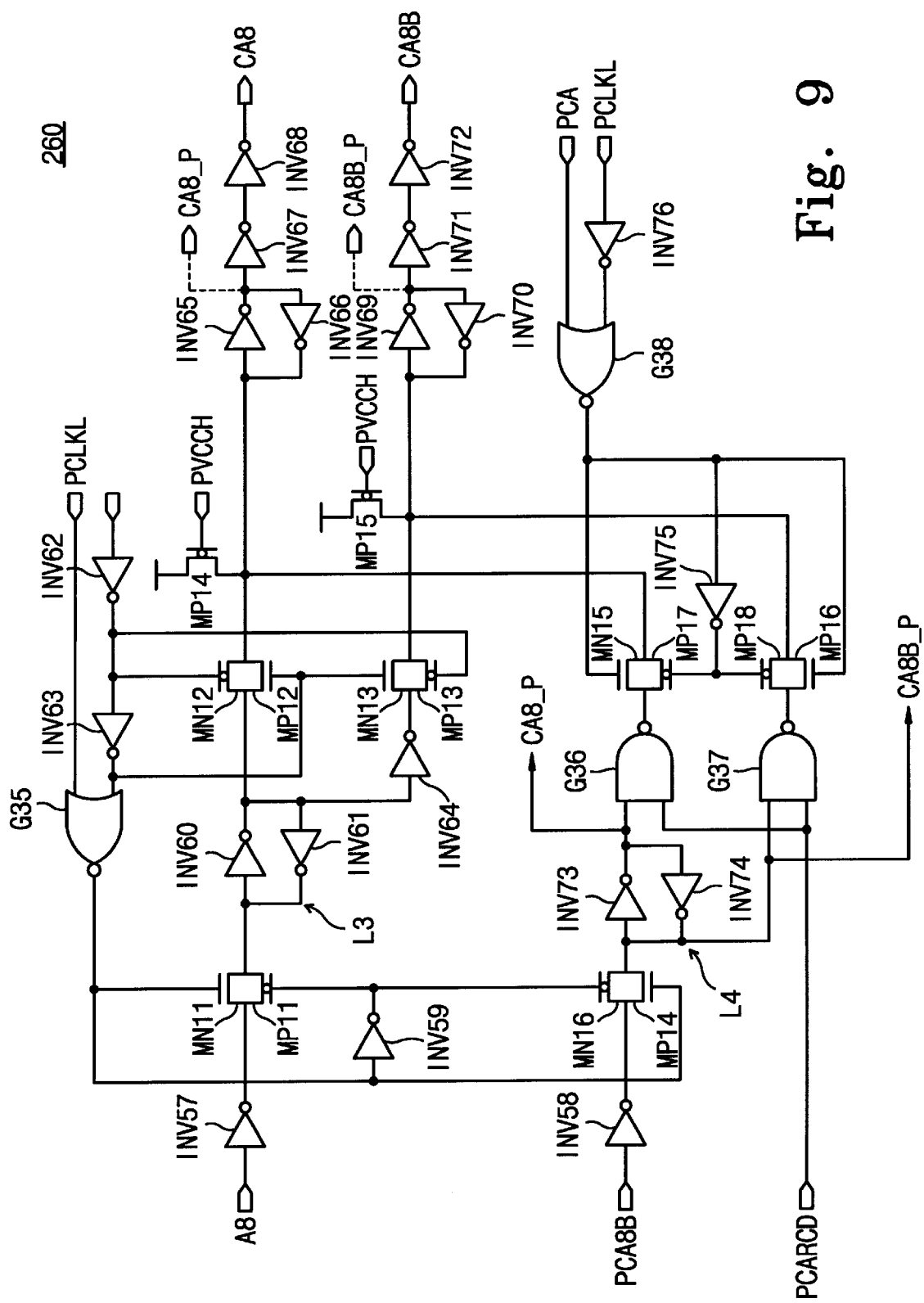
FIG. 9 is a partial circuit diagram of an address buffer circuit of FIG. 5.

As described above, the address signals CA8_P and CA8B_P are supplied from the address buffer circuit 260 in synchronization with a falling edge of the clock signal PCLK. FIG. 9 shows the address buffer circuit 260 according to an embodiment of the present invention. The address buffer circuit 260 receives one of two address signals A8 and PCA8B when the clock signal PCLK is low, and then latches the received address signal A8 or PCA8B in latch circuit L3 or L4. When the clock signal PCLK is high, the latched address signal A8 or PCA8B is converted to the address signals CA8B and CA8. The address signals CA8_P and CA8B_P, which are inputted to the address transition detector 310 in synchronization with the falling edge of the clock signal PCLK, are supplied from input and output terminals of the latch circuit L4, respectively. Herein, the address signal A8 is supplied from the outside when the column address strobe signal CASB is toggled at the normal mode, and the address signal PCA8B is supplied from the burst counter 270 at the full page mode. And, the address signals CA8_P and CA8B_P from output stage of the address buffer circuit 260 illustrated by a dot line in FIG. 9 can be supplied to the address transition detector 310.

Figure 8:
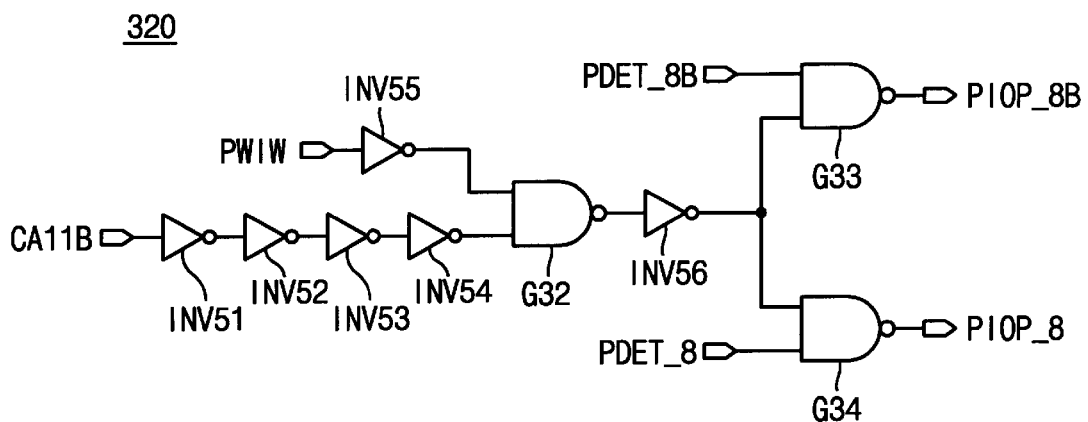
FIG. 8 is a circuit diagram of a precharge signal generator of FIG. 5.

Referring to FIG. 5, the precharge signal generator 320 issues the first and second precharge signals PIOP_8B and PIOP_8 in response to the detection signals PWIW, PDET_8B and PDET_8. FIG. 8 illustrates the precharge signal generator 320 according to an embodiment ol'the present invention. The precharge signal generator 320 includes three NAND gates G32, G33 and G34 and six invertors INV51 to INV56. When the write interrupt detection signal PWIW is high at the normal mode, the input terminal of the NAND gates G33 and G34 connecting to the invertor INV56 become low. Thus, both the first and the second precharge signals PIOP_8 and PIOP_8B become high.

As described above, in the full page mode, either the address transition detection signal PDET_8B or the address transition detection signal PDET_8 is high. According to which one of the signals PDET_8B and PDET_8 is high in the full page mode, one of the first and second precharge signals PIOP_8B and PIOP_8 is activated (high), and the other is inactivated (low). For example, when the first address transition detection signal PDET_8B is low (when the address signal CA8_P is high), the first precharge signal PIOP_8B is high, and the second precharge signal PIOP_8 is low.

According to an embodiment of the present invention, when the write interrupt WI is requested in the normal mode, the IO lines IOi and IOiB, and IOj and IOjB are simultaneously precharged according to the transition of external signals directing read or write at the normal mode. On the other hand, when the write interrupt WI is required at the full page mode, one of the IO line pairs IOi and IOiB, and IOj and IOjB is precharged according to the transition of the address signals CA8_P and CA8B_P.

Figure 4A:
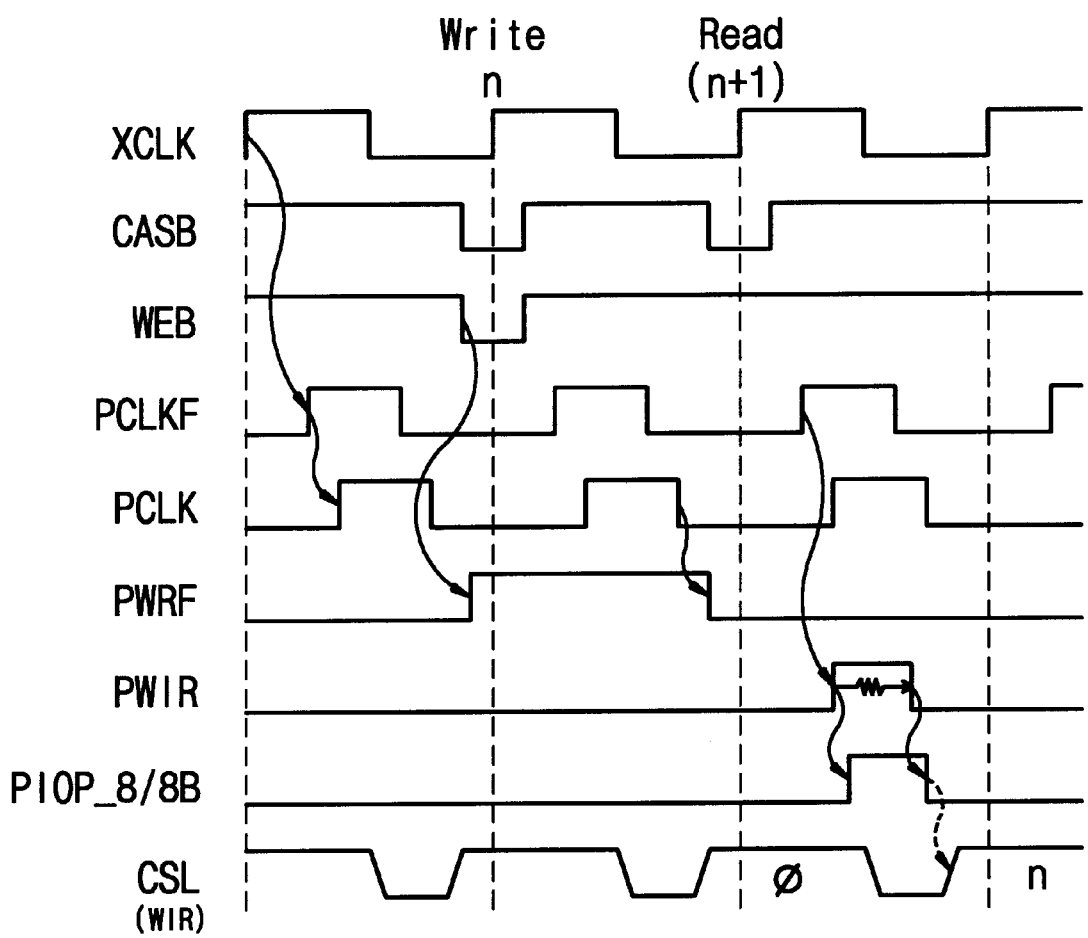
FIG. 4A is a timing diagram illustrating a write interrupt read operation in a normal mode of the DRAM of FIG. 1.
Figure 4B:
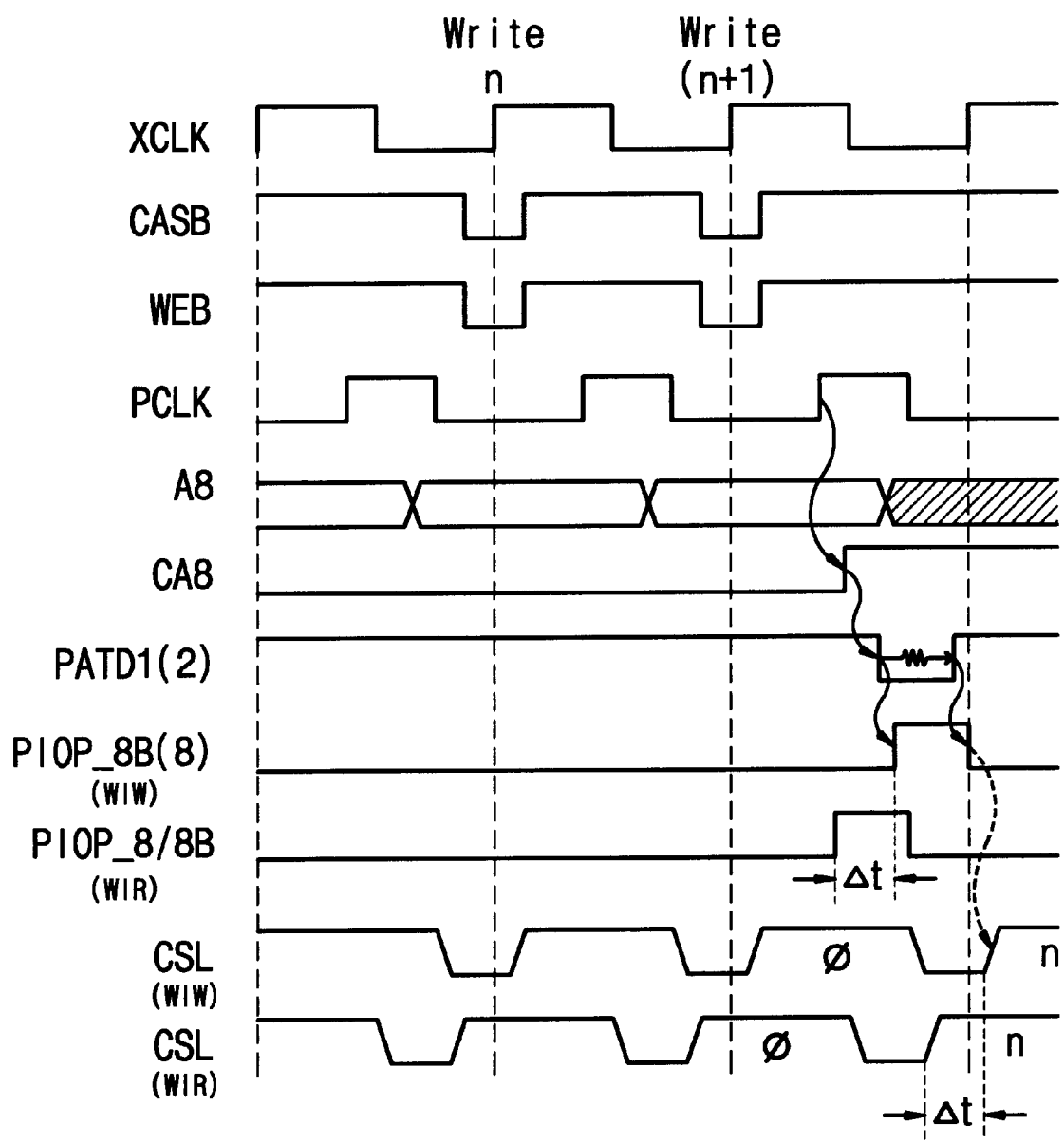
FIG. 4B is a timing diagram illustrating a write interrupt write operation in a normal mode of the DRAM of FIG. 1.

FIG. 10A is a timing diagram illustrating the write interrupt operation of the DRAM 200 (FIG. 5) in the normal mode according to an embodiment of the present invention. In the normal mode, the IO lines IOi and IOiB, and IOj and IOjB are simultaneously precharged whenever the write interrupt operation is requested. That is, the write interrupt detection signal PWIW from the write interrupt detector 290 is employed for the IO line precharge at the write interrupt read and write WIR and WIW operations. As a result, the IO precharge timing is the same both at the write interrupt read WIR operation and at the write interrupt write WIW operation. This means that the IO precharge time and the write time at the write interrupt write WIW operation become faster by Δt (FIG. 4B) than those associated with the prior art shown in FIG. 4B.

FIG. 10B is a timing diagram illustrating the write interrupt operation in the full page mode of the DRAM 200 according to an embodiment of the present invention. Referring to FIGS. 5, 7, 9, and 10B, the IO line precharge operation for the write interrupt of the DRAM 200 is explained. After data is sequentially written in the memory cells MC through the IO line pairs IOi and IOiB, and before data is written in the memory cells MC through the IO lines IOj and IOjB, the IO line pairs IOi and IOiB have to be precharged to prevent a write error.

Prior to the write operation associated with the IO lines IOj and IOjB, the burst counter 270 generates sequential address signals for assessing the IO lines IOj and IOjB. The sequential address signals are provided into the address buffer circuit 260 in synchronization with a falling edge of the clock signal PCLK. For example, the address signal PCA8B selecting between the IO lines IOi and IOiB, and the IO lines IOj and IOjB is latched in the latch circuit L4 of the address buffer circuit 260 in synchronization with a falling edge of the clock signal PCLK. Herein, it is assumed that the PCA8B is low.

Figure 4C:
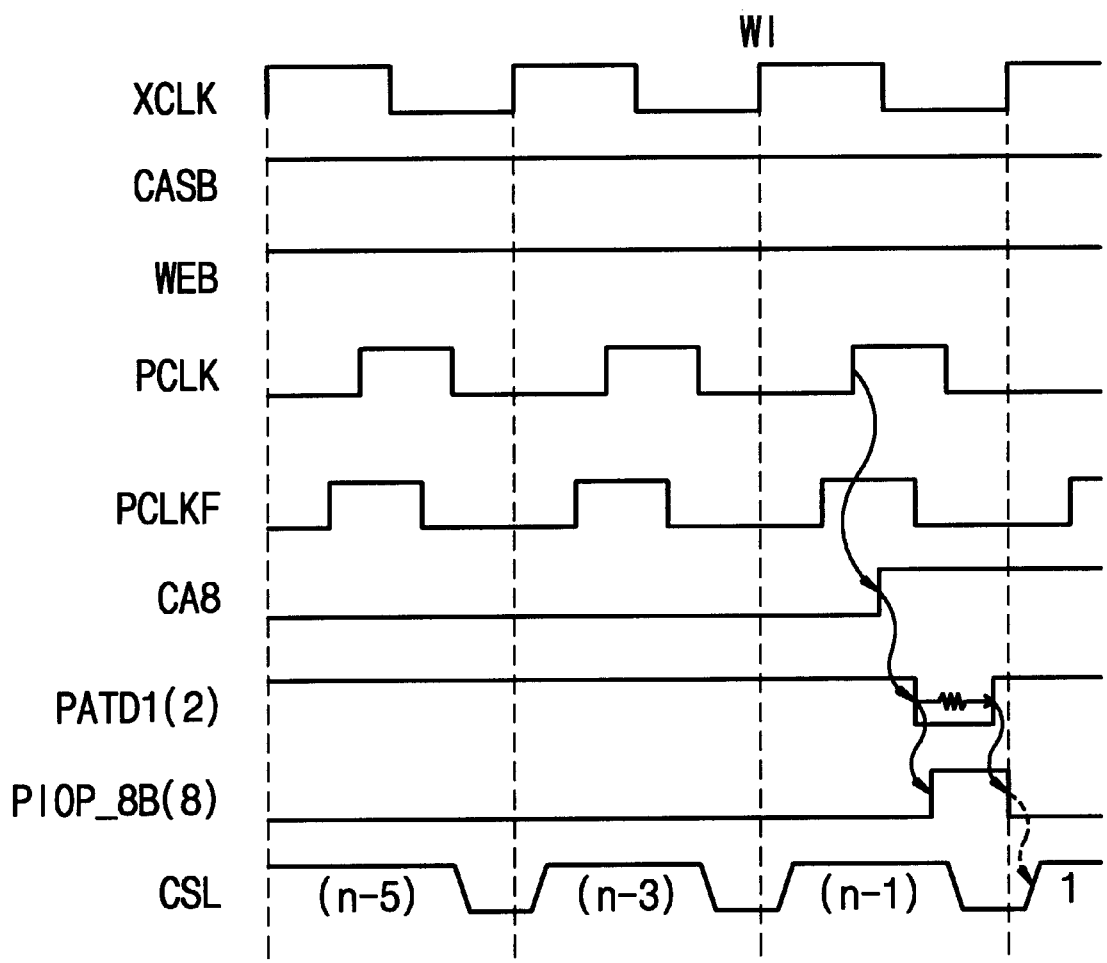
FIG. 4C is a timing diagram illustrating a write interrupt write operation in a full page mode of the DRAM of FIG. 1.

Then, the address transition detector 310 receives the address signals CA8_P and CA8B_P from the input and output terminals of the latch circuit L4, and detects which one of the address signals CA8_P and CA8B_P changes from low to high. In this embodiment, the address signal CA8_P becomes high, and the address signal CA8B_P becomes low. Since the full page mode detection signal PMDET is high as described above, the first address transition detection signal PDET_8B becomes low, and the second address transition detection signal PDET_8 becomes high. Then, responding to the detection signals PDET_8B and PDET_8, the precharge signal generator 320 makes the first precharge signal PIOP_8B high and the second precharge signal PIOP_8 low, and the IO lines IOi and IOiB are precharged through the first precharge circuit 240. Accordingly, at the full page mode, the 10 precharge timing becomes faster by Δt' than that of the prior art of FIG. 4C.

In accordance with the IO precharge scheme of the present invention, the IO lines at both side of the array of the DRAM are simultaneously precharged, the IO precharge timing of a WIW operation becomes the same as that of a WIR operation. Accordingly, the IO precharge time of a WIW is earlier than in the conventional DRAM. In addition, the IO precharge timing in the full page mode is earlier than that of the conventional DRAM. Therefore, the DRAM according to an embodiment of the present invention reduces the write time and shortens the address access time $t_{AA}$.

Although the invention has been described with reference to particular embodiments, the description is only an example of the inventor's application and should not be taken as limiting. Various adaptations and combinations of features of the embodiments disclosed are within the scope of the invention as defined by the following claims.

What is claimed is:

1. semiconductor memory device comprising:
   a memory cell array comprising a first group of memory cells and a second group of memory cells;
   a first group of input-output (IO) line pairs, the first group of IO line pairs transferring data to and from the first group of memory cells;
   a second group of IO line pairs, the second group of IO line pairs transferring data to and from the second group of memory cells;
   a precharge circuit precharging the first and second groups of IO line pairs, in response to a first precharge signal and a second precharge signal, respectively; and
   a precharge controller producing the first and second precharge signals, wherein in a normal mode operation of the memory device, the precharge controller activates the first and second precharge signals so that the first and second groups of IO line pairs are precharged when a write interrupt is detected, and in a full page mode, the precharge controller activates one of the first and second precharge signals so that one of the first and second groups of IO line pairs are precharged while data are written to the memory cell array through the other after writing data into the memory cell array through the one.

2. The semiconductor memory device according to claim 1, further comprising:
   a burst counter generating sequential addresses;
   a clock buffer receiving an externally applied clock signal and producing a first clock signal and a second clock signal, the second clock signal leading the first clock signal; and
   an address buffer having at least one latch, the latch holding one of the sequential addresses in synchronization with a falling edge of the first clock signal so as to select one of the first and second groups of IO line pairs, the address buffer outputting a signal held therein in synchronization with a rising edge of the first clock signal.

3. The semiconductor memory device according to claim 2, wherein the precharge controller comprises:
   a first detector generating a first detection signal synchronized with a rising edge of the second clock signal when the write interrupt is detected in the normal mode;
   a second detector detecting whether the device operates in the full page mode and producing a second detection signal when the device operates in the full page mode;
   a third detector that in response to the second detection signal, generates a third detection signal when a first signal from an output terminal of the latch changes from a first level to a second level and a fourth detection signal when a second signal from an input terminal of the latch changes from the first level to the second level, the first and second signals being complementary to each other; and
   a precharge signal generator generating the first and second precharge signals in the normal mode in response to the first detection signal and generating one of the first and second precharge signals in the full page mode in response to the third and fourth detection signals.

4. The semiconductor memory device according to claim 3, wherein the first and second levels are low and high, respectively.

5. The semiconductor memory device according to claim 3, wherein signals indicating the write interrupt comprises a write enable signal or a column address strobe signal.

6. A semiconductor memory device comprising:

a memory cell array comprising a first group of memory cells and a second group of memory cells;

a first group of input-output (IO) line pairs at one side of the memory cell array, the first group of IO line pairs transferring data to and from the first group of memory cells;

a second group of IO line pairs at the other side of the memory cell array, the second group of IO line pairs transferring data to and from the second group of memory cells;

a clock buffer receiving an externally applied clock signal and producing a first clock signal and a second clock signal, the second clock signal leading the first clock signal;

an address buffer having at least one latch, the latch holding an internally generated address in synchronization with a falling edge of the first clock signal so as to select one of the first and second groups of IO line pairs, the address buffer outputting a signal held therein in synchronization with an edge of the first clock signal;

a full page mode detector that detects whether the device operates in a full page mode and activates a full page mode detection signal when the device operates in the full page mode;

an address transition detector responsive to the full page mode detection signal, the address transition detector generating a first address transition detection signal when a first signal from an output terminal of the latch changes from a first level to a second level and generating a second address transition detection signal when a second signal from an input terminal of the latch changes from the first level to the second level, the first and second signals being complementary to each other;

a precharge signal generator generating a first precharge signal or a second precharge signal in response to the address transition detection signal in the full page mode; and an IO line precharge circuit precharging, in response to the precharge signal, one of the first and second groups of IO line pairs in the full page mode.

* * * * *